United States Patent
Wang et al.

(10) Patent No.: US 8,918,745 B2
(45) Date of Patent: Dec. 23, 2014

(54) STITCH INSERTION FOR REDUCING COLOR DENSITY DIFFERENCES IN DOUBLE PATTERNING TECHNOLOGY (DPT)

(71) Applicants: Lynn Wang, Fremont, CA (US); Sriram Madhavan, Santa Clara, CA (US); Luigi Capodieci, Santa Cruz, CA (US)

(72) Inventors: Lynn Wang, Fremont, CA (US); Sriram Madhavan, Santa Clara, CA (US); Luigi Capodieci, Santa Cruz, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/803,048

(22) Filed: Mar. 14, 2013

(65) Prior Publication Data
US 2014/0282301 A1      Sep. 18, 2014

(51) Int. Cl.
*G06F 17/50* (2006.01)
(52) U.S. Cl.
CPC .................................. *G06F 17/5068* (2013.01)
USPC .................. 716/54; 716/50; 716/51; 716/52; 716/53; 716/55

(58) Field of Classification Search
USPC .............................. 716/50, 51, 52, 53, 54, 55
See application file for complete search history.

(56) References Cited

U.S. PATENT DOCUMENTS

| | | | |
|---|---|---|---|
| 7,322,018 B2 * | 1/2008 | Rast et al. ........................ | 716/52 |
| 7,363,207 B2 * | 4/2008 | Kamon ............................ | 703/13 |
| 8,122,390 B2 * | 2/2012 | Yashima et al. ................. | 716/53 |
| 2011/0289471 A1 * | 11/2011 | Anikin et al. ................... | 716/132 |
| 2013/0198696 A1 * | 8/2013 | Wang et al. ...................... | 716/51 |
| 2014/0040836 A1 * | 2/2014 | Chou et al. ....................... | 716/52 |
| 2014/0042585 A1 * | 2/2014 | Peng et al. ...................... | 257/499 |

* cited by examiner

*Primary Examiner* — Vuthe Siek
*Assistant Examiner* — Brian Ngo
(74) *Attorney, Agent, or Firm* — Ditthavong & Steiner, P.C.

(57) ABSTRACT

Methodology enabling a reduction in a density difference between two complementary exposure masks and/or windows of a layout and an apparatus for performing the method are disclosed. Embodiments include: determining a layer of an IC design having features to be resolved by first and second masks; determining a difference of density by comparing a first density of a first set of the features with a second density of a second set of the features; determining a region on the layer of a first feature to be resolved by the first mask; and inserting, within the region, a polygon to be resolved by the second mask based on the difference of density.

20 Claims, 6 Drawing Sheets

300

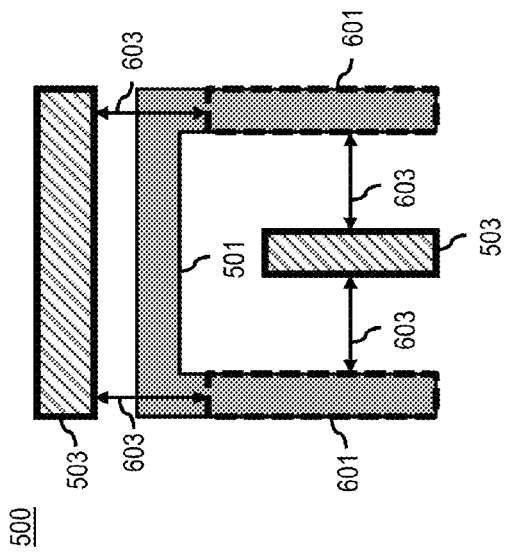
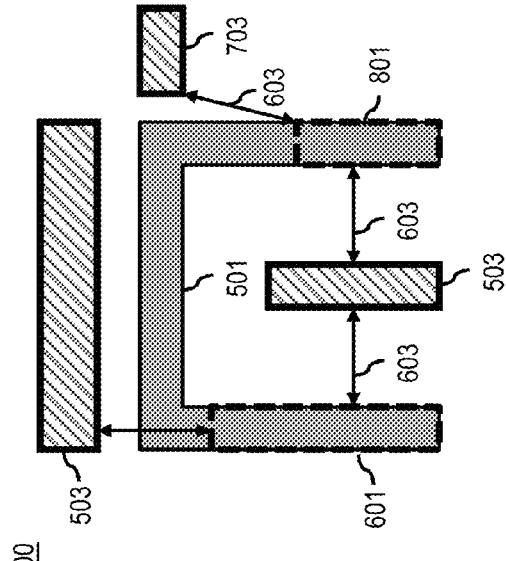
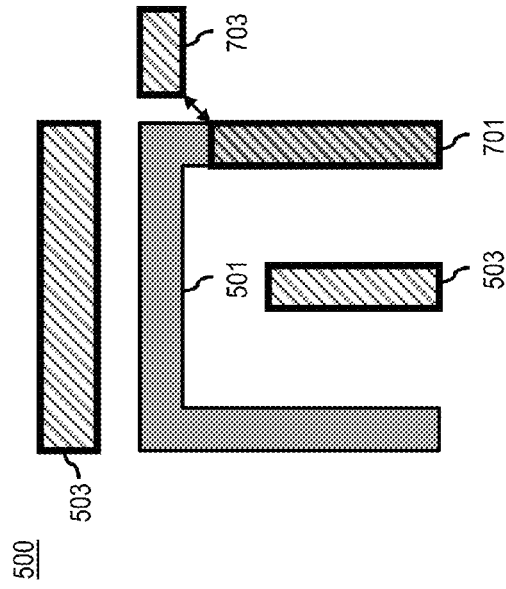

STITCH INSERTION FOR REDUCING COLOR DENSITY DIFFERENCES IN DOUBLE PATTERNING TECHNOLOGY (DPT)

TECHNICAL FIELD

The present disclosure relates to manufacture of semiconductor devices utilizing Double Patterning Technology (DPT). The present disclosure is particularly applicable to generating stitches in an integrated circuit (IC) design during a design stage to reduce a density difference between two complementary exposure masks of a DPT process.

BACKGROUND

In fabrication of semiconductor devices, traditional methods attempting to reduce a color density difference between two complementary exposure masks include using coloring assignments or using colored dummy fill and fill stitches. However, coloring assignments are often times overly restrictive; due to design rule constraints, changing coloring assignments would require a complete redesign of the IC design. In addition, changing color assignments can perturb a design hierarchy of an IC design. For example, each instantiation of a standard cell in a large chip may require a different coloring due to a change in context, and, therefore, the hierarchy cannot be preserved. This lack of design hierarchy slows down the runtime of standard IC design tools, such as design-rule-check engines and automated routers, which increases the overall design cycle time. Relying on a dummy fill to insert colored polygons into white spaces of an IC design allows more design flexibility than coloring assignments. However, as the density of IC designs increases with scaling of each technology node, availability of white spaces decreases. Fill stitches, which are colored polygons inserted in wide metal lines, have also been proposed to mitigate density balance. However, due to the scaling of designs with each technology node, wide metal lines may not be used.

A need therefore exists for a methodology enabling a reduction of a density difference between two complementary exposure masks of a DPT process allowing design flexibility in IC designs, particularly high density IC designs, and an apparatus for performing the method.

SUMMARY

An aspect of the present disclosure is a method of reducing a density difference between features of two complementary exposure masks of a DPT process and/or adjacent windows of a layout by, inter alia, inserting a polygon (e.g., a stitch) to be resolved by a first mask into a region of a feature to be resolved by a second mask.

Another aspect of the present disclosure is an apparatus configured to determine, inter alia, a polygon to be resolved by a first mask to be inserted in a region of a feature to be resolved by a second mask.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a layer of an IC design having features to be resolved by first and second masks; determining a difference of density by comparing a first density of a first set of the features with a second density of a second set of the features; determining a region on the layer of a first feature to be resolved by the first mask; and inserting, within the region, a polygon to be resolved by the second mask based on the difference of density.

Aspects include determining a distance between an outer edge of the region to a feature to be resolved by the second mask, wherein the insertion of the polygon is further based on the distance. Additional aspects include comparing the distance with a critical distance associated with the first and/or second mask, wherein the insertion of the polygon is further based on the comparison of the distance with the critical distance. Some aspects include: determining a second difference of density by comparing the first density of the first set of the features to the second density of the second set of the features and a density of the polygon; and determining a portion of the region based on the first and/or second difference of density, wherein the polygon is positioned within the portion. Further aspects include: determining a second region on the layer of a second feature to be resolved by the first mask; selecting the first or second region based on a comparison of an area of each of the first and second regions, wherein the insertion of the polygon is further based on the comparison of the area of each of the first and second regions; and initiating a design rule check of only a portion of the IC design, the portion including the polygon. Some aspects include a method, wherein the first set of features are to be resolved by the first mask, and the second set of features are to be resolved by the second mask. Additional aspects include a method, wherein the first set of features are positioned in a first portion of the layer, and the second set of features are positioned in a second portion of the layer separated from the first portion. Further aspects include: determining a second difference of density by comparing the first density of the first set of the features to the second density of the second set of the features and a density of the polygon; comparing the second difference of density to a threshold; and determining whether to insert another polygon to be resolved by the second mask based on the comparison of the second difference of density to the threshold.

Another aspect of the present disclosure is a device configured to: determine a layer of an IC design having features to be resolved by first and second masks; determine a difference of density by comparing a first density of a first set of the features with a second density of a second set of the features; determine a region on the layer of a first feature to be resolved by the first mask; and insert, within the region, a polygon to be resolved by the second mask based on the difference of density.

Aspects include a device configured to determine a distance between an outer edge of the region to a feature to be resolved by the second mask, wherein the insertion of the polygon is further based on the distance. Some aspects include a device configured to compare the distance with a critical distance associated with the first and/or second mask, wherein the insertion of the polygon is further based on the comparison of the distance with the critical distance. Additional aspects include a device configured to: determine a second difference of density by comparing the first density of the first set of the features to the second density of the second set of the features and a density of the polygon; and determine a portion of the region based on the first and/or second difference of density, wherein the polygon is positioned within the portion. Further aspects include a device configured to: determine a second region on the layer of a second feature to be resolved by the first mask; select the first or second region based on a comparison of an area of each of the first and second regions, wherein the insertion of the polygon is further based on the comparison of the area of each of the first and second regions; and initiate a design rule check of only a portion of the IC design, the portion including the polygon. Additional aspects include wherein the first set of features are to be resolved by the first mask and the second set of features are to be resolved by the second mask. Some aspects include wherein the first set of features are positioned in a first portion of the layer and the second set of features are positioned in a second portion of the layer separated from the first portion. Further aspects include a device configured to: determine a second difference of density by comparing the first density of the first set of the features to the second density of the second set of the features and a density of the polygon; compare the second difference of density to a threshold; and determine whether to insert another polygon to be resolved by the second mask based on the comparison of the second difference of density to the threshold.

Another aspect of the present disclosure is a method including: determining a layer of an IC design having features to be resolved by at least a first and second mask; determining first and second densities of first and second sets of the features; determining a first difference of density by comparing the first and second densities; determining a third set of the features in the layer to be resolved by the first mask; selecting a fourth set of one or more features from the third set based on whether an outer edge of a respective feature is separated by a critical distance from a feature to be resolved by the second mask, the critical distance being associated with the first and/or second mask; determining a target area according to the first difference of density; selecting a feature from the fourth set based on a comparison of an area of each of the features of the fourth set with the target area; determining a region of the layer corresponding to a position and area of the selected feature; inserting a first polygon to be resolved by the second mask within the region; determining a second difference of density by comparing the first density of the first set of the features to the second density of the second set of the features and a density of the polygon; and determining another polygon to be resolved by the second mask based the second difference of density when the second difference of density exceeds a threshold value.

Some aspects include: determining a portion of the region based on the first and/or second difference of density, wherein the first polygon is positioned within the portion of the region; and initiating a design rule check of only a portion of the IC design, the portion of the IC design including the first polygon. Further aspects include a method, wherein the first set of features are to be resolved by the first mask, and the second set of features are to be resolved by the second mask. Some aspects include a method, wherein the first set of features are positioned in a first portion of the layer, and the second set of features are positioned in a second portion of the layer separated from the first portion.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 5 through 11 schematically illustrate a process for reducing a density difference between two complementary exposure masks of a DPT process, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of an imbalance in densities of two complementary exposure masks of a DPT process and/or of densities of adjacent windows of a layout, particularly in high density IC designs. In accordance with embodiments of the present disclosure, the problems are solved, for instance by, inter alia, insertion of one or more stitches.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
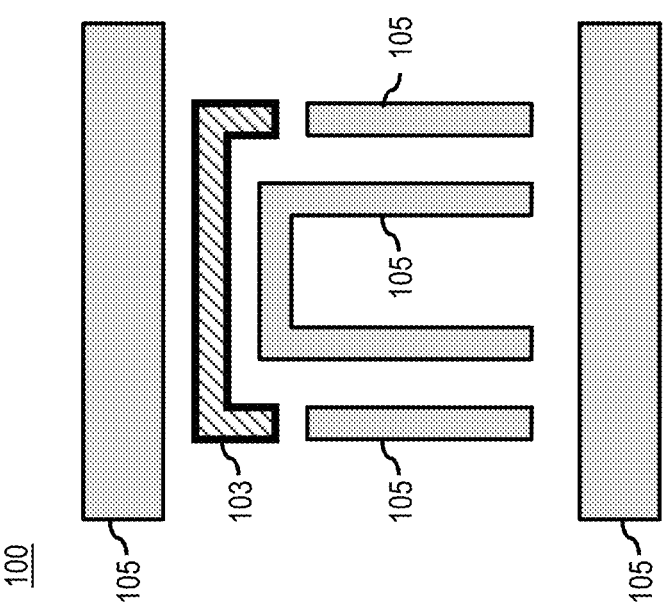

Adverting to FIG. 1, in accordance with exemplary embodiments, a substrate 100, for example a bulk silicon substrate, is provided with feature 103 and features 105 being decomposed into a first and a second of two complementary exposure masks, respectively, of a DPT process. However, feature 103 has a lower density than the combination of features 105, which may result in a poor manufacturability and yield of formation of the substrate 100 by the two complementary exposure masks. As noted above, utilization of color rules and insertion of dummy fill and fill stitches to reduce a density difference between two complementary exposure masks are inflexible and/or unable to reduce the density differences.

Figure 2:
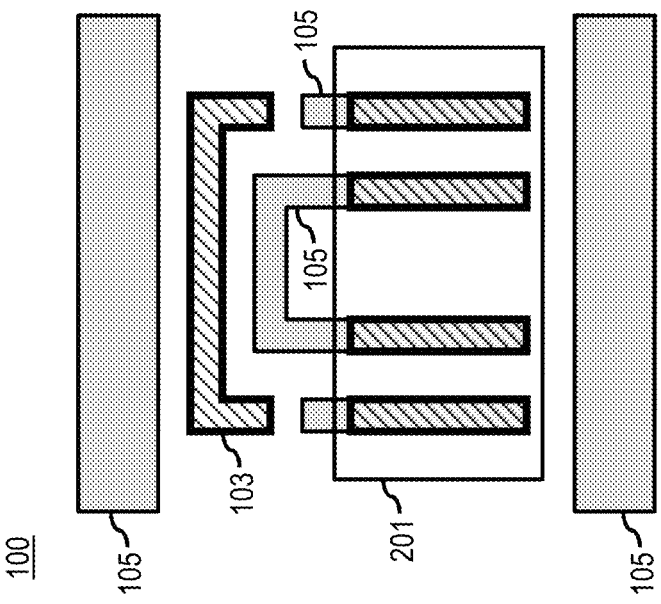
FIGS. 1 and 2 schematically illustrate forming stitches, in accordance with an exemplary embodiment.

Adverting to FIG. 2, in accordance with exemplary embodiments, stitches 201 are added over portions of the features 105, without incurring any design rule check (DRC) violations. As shown, stitches 201 are implemented as an additional cell, and thus do not perturb design hierarchy. Furthermore, the stitches 201 overlap space utilized by another mask, and thus do not require use of white space on the substrate 100. As shown, the density difference of FIG. 1 of 87.5% was reduced to 68.1% in FIG. 2, resulting in an improvement of 19.4%. Although illustrated as lines, stitches (e.g., 201) may have various dimensions and/or be shaped, for instance, L-shaped, circular, rectangular, square, and the like.

Figure 3:
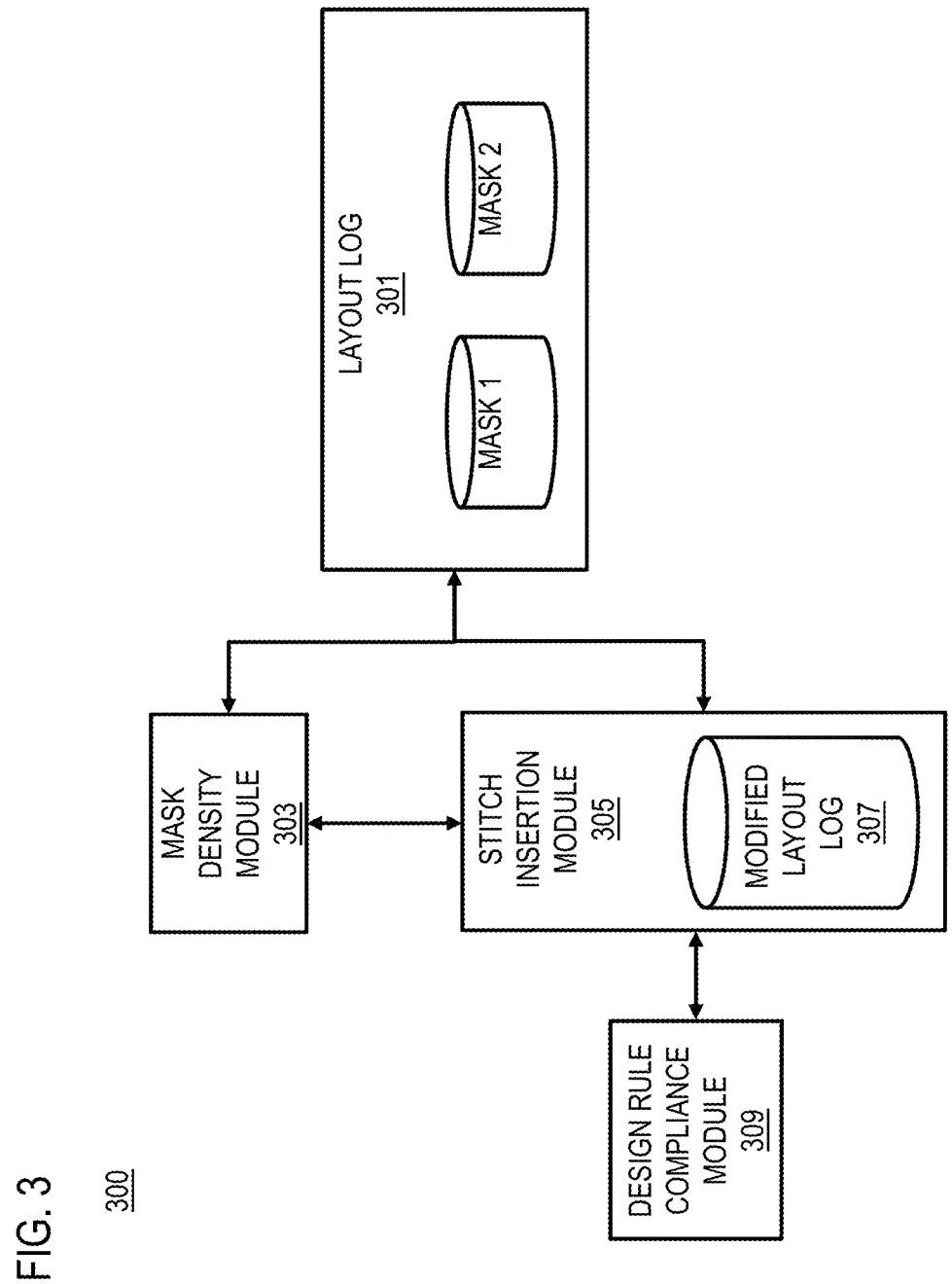
FIG. 3 illustrates a system for inserting stitches, according to an exemplary embodiment.

Adverting to FIG. 3, a system 300 includes layout log 301, mask density module 303, stitch insertion module 305 having a modified layout log 307, and design rule compliance module 309. Modules 303, 305, and 309 may be combined. Additionally, or alternatively, logs 301 and 307 may be combined.

Mask density module 303 is configured to compare densities retrieved from layout log 301 to a threshold value. A difference in density may be determined between windows of a layout to enable a reduction in a density difference gradient across a chip. For instance, the mask density module 303 determines a difference of density by comparing a density of features of a first portion or window of a layout to a density of features of a second portion or window of the layout. Alternatively, a difference in density may be determined between features resolved by a first mask and features resolved by a second mask within (a portion of) an entire layout (e.g., across a chip) to enable a reduction in a density difference between complementary exposure masks. For example, the mask density module 303 determines a difference in density by comparing a density of first features to be resolved in a first mask to a density of second features to be resolved in a second mask. Next, the mask density module 303 compares the density difference to a threshold. The threshold may be defined by the foundry as a percentage density difference, a yield-based score, and the like. The mask density module 303 may quantify a density difference and identify a region and/or mask (e.g., color-aware) to allow a determination of which colored polygons (e.g., stitches) to insert. Additionally, mask density module 303 may compare mask densities after insertion of stitch(es) (e.g., dynamically) to ensure an improvement in a density balance.

Insertion module 305 is configured to insert stitches into layout log 301. For instance, insertion module 305 receives an amount of density to add to a first mask of layout log 301. Next, the insertion module 305 generates a modified layout log 307 corresponding to the layout log 301 with an inserted stitch to be resolved by the first mask, initiates a design rule check of the modified layout log 307, and inserts the stitch into the layout log 301 based on the design rule check. The insertion module 305 may remove inserted stitches when a design rule check indicates non-compliance due to the insertion and/or when a comparison of densities with the stitch indicates an increase in density imbalance. For example, the insertion module 305 removes a stitch having a density exceeding the threshold of density imbalance.

Compliance module 309 is configured to verify that a layout is compliant with a set of rules. For instance, the compliance module 309 executes a filtering function identifying a set of features complying with a first partial set of design rules. In another example, the compliance module 309 verifies a particular polygon or feature is compliant with a second partial set of design rules within a predetermined distance from the particular feature or polygon. In another example, the compliance module 309 verifies an entire layout with the full set of design rules. As used herein, design rules may include DRC rules, DRC/DPT rules, and the like.

Figure 4:
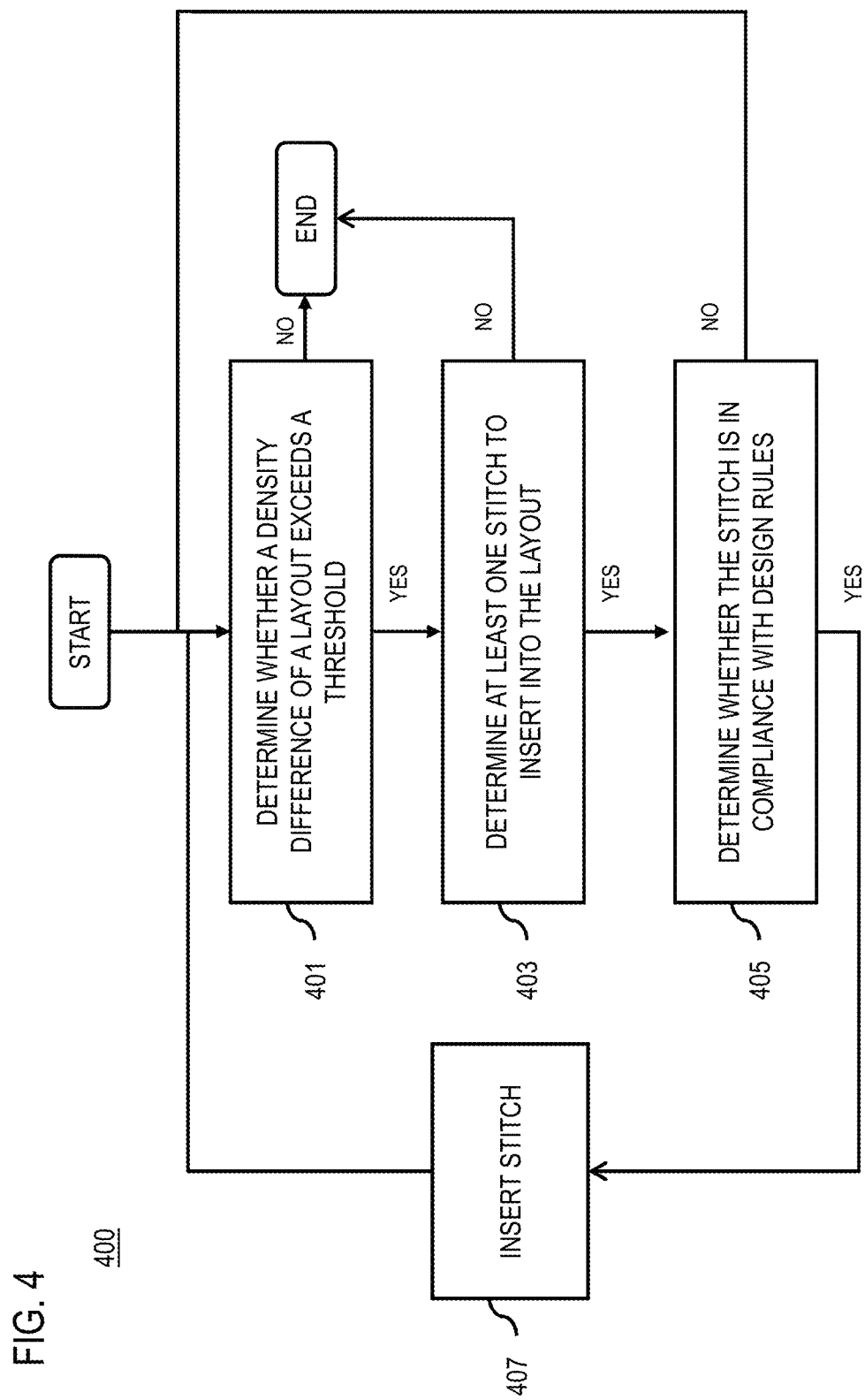
FIG. 4 is a flowchart of a process for inserting stitches, according to an exemplary embodiment.

Adverting to FIG. 4, in accordance with exemplary embodiments, a flowchart illustrates a process for inserting stitches. For illustrative purpose, process 400 is described with respect to the system of FIG. 3. It is noted that the steps of process 400 may be performed in any suitable order, as well as combined or separated in any suitable manner.

In step 401, mask density module 303 determines whether a density difference of a layout exceeds a threshold. For instance, the mask density module 303 determines a difference in density by comparing features to be resolved by a first mask of an entire layout stored in layout log 301 (or log 307) to features to be resolved by a second mask of the entire layout stored in layout log 301 (or log 307). The mask density module 303 then ends the process 400 when the difference in density is within a threshold, and initiates step 403 when the difference exceeds the threshold.

In step 403, the compliance module 309 determines whether at least one region is available in a layout to insert a stitch to be resolved by a particular mask. For instance, compliance module 309 filters potential regions to insert a stitch by performing a partial set of rule checks on the entire layout stored in layout log 301 and/or filtering regions previously indicated as non-compliant by compliance module 309. The compliance module 309 then ends the process 400 when it cannot identify such a region, and initiates step 405 when it can identify such a region.

In step 405, the compliance module 309 determines whether a stitch, if inserted, is in compliance with a set of design rules. For example, compliance module 309 verifies that the entire layout stored in layout log 301 (or 307) with the polygon determined in step 403 is in compliance with a complete set of rules. The compliance module 309 then updates a log indicating the polygon results in non-compliance and initiates step 401 when the polygon results in non-compliance, and initiates an insertion (step 407) of the stitch into log 301 (or 307) when the entire layout is compliant.

FIGS. 5 through 11 schematically illustrate a process for reducing a density difference between two complementary exposure masks of a DPT process, in accordance with an exemplary embodiment. For illustrative purpose, the process is described with respect to the system of FIG. 3. It is noted that the steps of the process may be performed in any suitable order, as well as combined or separated in any suitable manner.

FIGS. 5 through 11 include a substrate 500, for example a bulk silicon substrate, provided with feature 501 and features 503 being decomposed into a first and a second of two complementary exposure masks, respectively, of a DPT process.

Adverting to FIG. 5, mask density module 303 determines that feature 501 has a density exceeding a combined density of features 503 by at least a threshold and initiates a determination of regions for insertion of stitches to be resolved by a mask resolving features 503.

Adverting to FIG. 6, compliance module 309 determines regions 601 to be potential regions for insertion of a stitch by being separated by a distance 603 (e.g., critical distance) from features 503. Next, as illustrated in FIG. 7, the insertion module 305 inserts stitch 701 to be resolved by the mask resolving features 503. The compliance module 309 then performs a complete compliance check on an entire (or partial) layout and identifies stitch 701 results in non-compliance due to the proximity of stitch 701 to feature 703. The insertion module 305 then drops the added stitch 701.

Figure 9:
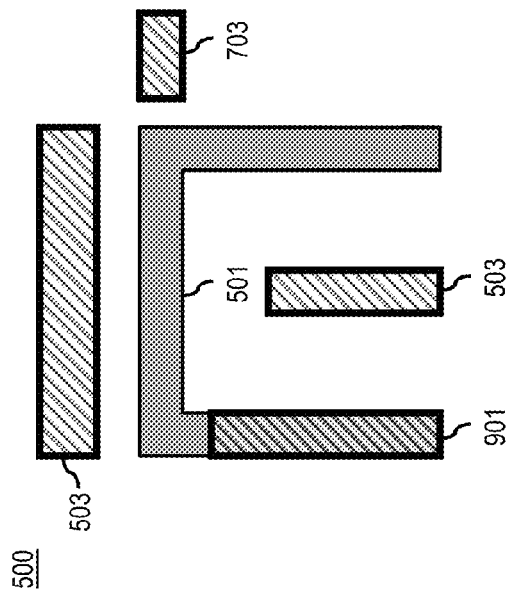

Adverting to FIG. 8, the compliance module 309 determines regions 601 and 801 to be potential regions for insertion of a stitch by being separated a distance 603 from features 503 and 703, respectively. Next, as shown in FIG. 9, the insertion module 305 inserts a stitch 901 to be resolved by the mask resolving features 503 because region 601 is closer than region 801 to a target area identified by the mask density module 303. The compliance module 309 then determines an entire layout with stitch 901 to be compliant with a complete set of design rules. Next, mask density module 303 determines that feature 501 still has a density exceeding a combined density of features 503 and stitch 901 by at least a threshold and initiates a determination of regions for insertion of additional stitches to be resolved by a mask resolving features 503 and stitch 901.

Figure 10:
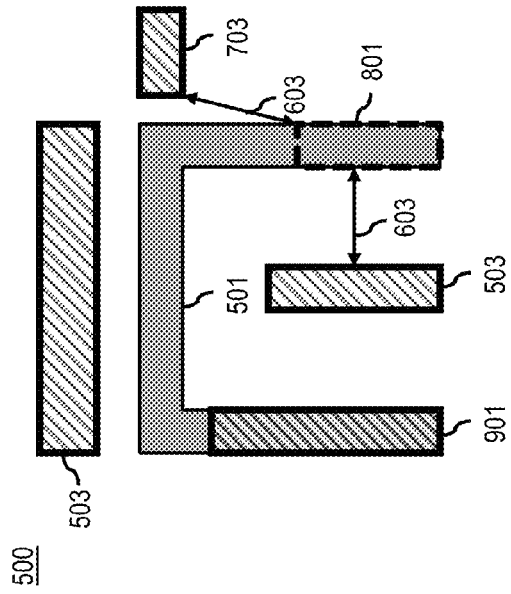
Figure 11:
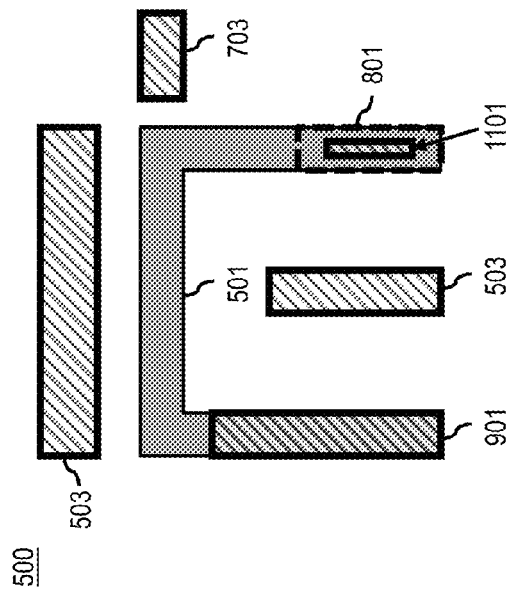

Adverting to FIG. 10, the compliance module 309 determines region 801 to be a potential region for insertion of a stitch by being separated a distance 603 from features 503 and stitch 901. As shown in FIG. 11, insertion module 305 inserts stitch 1101 to be resolved by the mask resolving features 503. As shown, stitch 1101 has smaller dimensions than region 801 such that density added by the stitch 1101 does not exceed the amount of density imbalance. The mask density module 303 determines a density difference within the threshold between feature 501 and a combined density of features 503, 901, and 1101 and, therefore, ends the process 400.

The methodologies of FIGS. 1 though 11 have been demonstrated on a 22 by 72 um² layout generated through the random placement of 44 standard cells from GLOBAL-FOUNDRIES 9T 20-LPM standard cell library. Of the 44 cells, 9 cells were identified and modified for density balance improvements using the foregoing methodologies. The methodologies were performed on the m1_e1 (e.g, E1) and m1_e2 (e.g., E2) layers.

Table 1 is a summary of the density balance improvements for each standard cell. Only E2 stitches are inserted to mitigate the differences in density in the demonstration, since the designs are biased towards E1 due to the fixed power rail coloring. The apostrophes (i.e., ') indicate the properties of the modified layout. Improvements of up to 9.1% were achieved in the demonstration.

TABLE 1

Summary of the density balance results before and after the insertion of stitches to mitigate the density difference between the m1_e1 (e.g., E1) and m1_e2 (e.g., E2) exposure masks.

| Cell Name | E1 (um²) | E1' (um²) | E2 (um²) | E2' (um²) | Density Difference (%) | Density Difference' (%) | Improvement (%) |
|---|---|---|---|---|---|---|---|
| bfx11 | 0.353 | 0.353 | 0.180 | 0.192 | 49.0 | 45.6 | 3.4 |
| aoi222x1 | 0.194 | 0.194 | 0.058 | 0.072 | 70.1 | 62.9 | 7.2 |
| aoi21x4 | 0.315 | 0.315 | 0.103 | 0.126 | 67.3 | 60.0 | 7.3 |
| aoi21x1 | 0.128 | 0.128 | 0.029 | 0.040 | 77.3 | 68.8 | 8.6 |
| ao33x1 | 0.230 | 0.230 | 0.067 | 0.075 | 70.9 | 67.4 | 3.5 |
| ao1b2x4 | 0.311 | 0.311 | 0.082 | 0.087 | 73.6 | 72.0 | 1.6 |
| ao1b2x2 | 0.187 | 0.187 | 0.065 | 0.082 | 65.2 | 56.1 | 9.1 |
| an2x2 | 0.137 | 0.137 | 0.030 | 0.037 | 78.1 | 73.0 | 5.1 |
| sdffqx1 | 0.492 | 0.492 | 0.178 | 0.183 | 63.8 | 62.8 | 1.0 |

The overall improvement for the generated 22 by 72 um² block is shown in Table 2. "Before" indicates the layout generated from the original 20-LPM standard cells. "After" indicates the same generated block using the modified standard cells (e.g. those in Table 1). A 32.7% density difference is observed with the original cells. Using the modified cells that include stitches, the density difference improves by 1.6%.

TABLE 2

A 1.6% improvement in density difference is demonstrated for a 22 × 72 um² generated block using the random placement of 44 cells from the 20-LPM standard cell library.

| | E1 (um²) | E2 (um²) | Density Difference (%) |
|---|---|---|---|
| Before | 393.67 | 264.81 | 32.7 |
| After | 393.67 | 270.94 | 31.2 |
| Improvement (%) | | | 1.6 |

Figure 12:
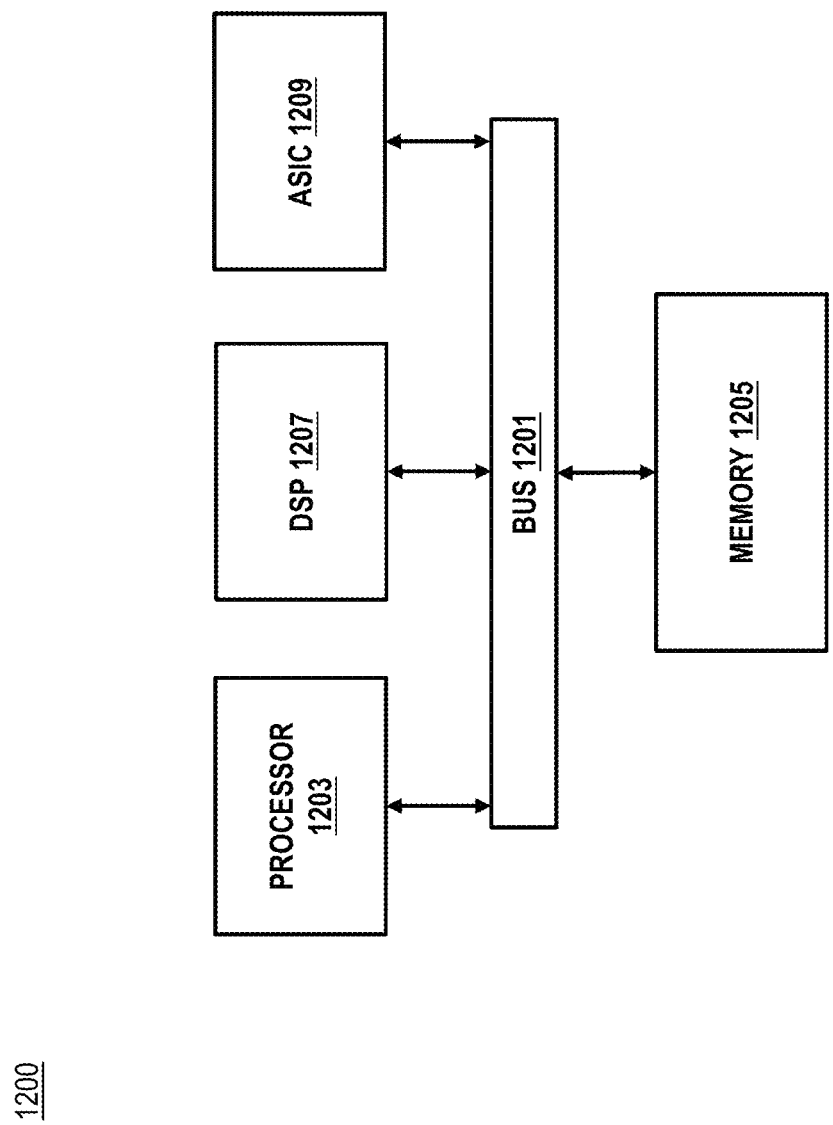
FIG. 12 illustrates a diagram of a chip set that can be used to implement exemplary embodiments.

FIG. 12 is a diagram of a chip set that can be used to implement various exemplary embodiments. Chip set 1200 is programmed to determine a region to insert a stitch as described herein and includes, for instance, the processor and memory components described with respect to FIG. 12 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 1200, or a portion thereof, constitutes a means for performing one or more steps of FIGS. 1 through 11.

The chip set 1200 may include a communication mechanism such as a bus 1201 for passing information among the components of the chip set 1200. A processor 1203 has connectivity to the bus 1201 to execute instructions and process information stored in, for example, a memory 1205. The processor 1203 may include one or more processing cores with each core configured to perform independently. A multi-core processor enables multiprocessing within a single physical package. Examples of a multi-core processor include two, four, eight, or greater numbers of processing cores. Alternatively or in addition, the processor 1203 may include one or more microprocessors configured in tandem via the bus 1201 to enable independent execution of instructions, pipelining, and multithreading. The processor 1203 may also be accompanied by one or more specialized components to perform certain processing functions and tasks such as one or more digital signal processors (DSP) 1207, or one or more application-specific integrated circuits (ASIC) 1209. A DSP 1207 typically is configured to process real-world signals (e.g., sound) in real time independently of the processor 1203. Similarly, an ASIC 1209 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1203 and accompanying components have connectivity to the memory 1205 via the bus 1201. The memory 1205 includes both dynamic memory (e.g., RAM, magnetic disk, writable optical disk, etc.) and static memory (e.g., ROM, CD-ROM, etc.) for storing executable instructions that when executed perform the inventive steps described herein. The memory 1205 also stores the data associated with or generated by the execution of the inventive steps.

The embodiments of the present disclosure can achieve several technical effects, including a reduction of a density difference between two complementary exposure masks of a DPT process, thereby allowing improved manufacturability and yield for DPT processes. The present disclosure enjoys industrial applicability in any of various types of highly integrated semiconductor devices, particularly high density IC designs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining, via at least one processor, a layer of an integrated circuit (IC) design having features to be resolved by first and second masks;
   determining, via the at least one processor, a difference of density by comparing a first density of a first set of the features with a second density of a second set of the features;
   determining a region on the layer of a first feature to be resolved by the first mask; and
   inserting, within the region, a polygon to be resolved by the second mask based on the difference of density.

2. The method according to claim 1, comprising:
   determining a distance between an outer edge of the region to a feature to be resolved by the second mask, wherein the insertion of the polygon is further based on the distance.

3. The method according to claim 2, comprising:
   comparing the distance with a critical distance associated with the first and/or second mask, wherein the insertion of the polygon is further based on the comparison of the distance with the critical distance.

4. The method according to claim 1, comprising:
   determining a second difference of density by comparing the first density of the first set of the features to the second density of the second set of the features and a density of the polygon; and
   determining a portion of the region based on the first and/or second difference of density, wherein the polygon is positioned within the portion.

5. The method according to claim 1, comprising:
   determining a second region on the layer of a second feature to be resolved by the first mask;
   selecting the first or second region based on a comparison of an area of each of the first and second regions, wherein the insertion of the polygon is further based on the comparison of the area of each of the first and second regions; and
   initiating a design rule check of only a portion of the IC design, the portion comprising the polygon.

6. The method according to claim 1, wherein the first set of features are to be resolved by the first mask, and the second set of features are to be resolved by the second mask.

7. The method according to claim 1, wherein the first set of features are positioned in a first portion of the layer, and the second set of features are positioned in a second portion of the layer separated from the first portion.

8. The method according to claim 1, comprising:
   determining a second difference of density by comparing the first density of the first set of the features to the second density of the second set of the features and a density of the polygon;
   comparing the second difference of density to a threshold; and
   determining whether to insert another polygon to be resolved by the second mask based on the comparison of the second difference of density to the threshold.

9. An apparatus comprising:
   at least one processor; and
   at least one memory including computer program code for one or more programs,
   the at least one memory and the computer program code configured to, with the at least one processor, cause the apparatus to perform at least the following,
   determine a layer of an integrated circuit (IC) design having features to be resolved by first and second masks;
   determine a difference of density by comparing a first density of a first set of the features with a second density of a second set of the features;
   determine a region on the layer of a first feature to be resolved by the first mask; and
   insert, within the region, a polygon to be resolved by the second mask based on the difference of density.

10. The apparatus according to claim 9, wherein the apparatus is further caused to:
    determine a distance between an outer edge of the region to a feature to be resolved by the second mask, wherein the insertion of the polygon is further based on the distance.

11. The apparatus according to claim 10, wherein the apparatus is further caused to:
    compare the distance with a critical distance associated with the first and/or second mask, wherein the insertion of the polygon is further based on the comparison of the distance with the critical distance.

12. The apparatus according to claim 9, wherein the apparatus is further caused to:
    determine a second difference of density by comparing the first density of the first set of the features to the second density of the second set of the features and a density of the polygon; and
    determine a portion of the region based on the first and/or second difference of density, wherein the polygon is positioned within the portion.

13. The apparatus according to claim 9, wherein the apparatus is further caused to:
    determine a second region on the layer of a second feature to be resolved by the first mask;
    select the first or second region based on a comparison of an area of each of the first and second regions, wherein the insertion of the polygon is further based on the comparison of the area of each of the first and second regions; and
    initiate a design rule check of only a portion of the IC design, the portion comprising the polygon.

14. The apparatus according to claim 9, wherein the first set of features are to be resolved by the first mask, and the second set of features are to be resolved by the second mask.

15. The apparatus according to claim 9, wherein the first set of features are positioned in a first portion of the layer, and the second set of features are positioned in a second portion of the layer separated from the first portion.

16. The apparatus according to claim 9, wherein the apparatus is further caused to:

determine a second difference of density by comparing the first density of the first set of the features to the second density of the second set of the features and a density of the polygon;

compare the second difference of density to a threshold; and determine whether to insert another polygon to be resolved by the second mask based on the comparison of the second difference of density to the threshold.

17. A method comprising:

determining, via at least one processor, a layer of an integrated circuit (IC) design having features to be resolved by at least a first and second mask;

determining, via the at least one processor, first and second densities of first and second sets of the features, respectively;

determining a first difference of density by comparing the first and second densities;

determining a third set of the features in the layer to be resolved by the first mask;

selecting a fourth set of one or more features from the third set based on whether an outer edge of a respective feature is separated by a critical distance from a feature to be resolved by the second mask, the critical distance being associated with the first and/or second mask;

determining a target area according to the first difference of density;

selecting a feature of the fourth set based on a comparison of an area of each of the features of the fourth set with the target area;

determining a region of the layer corresponding to a position and area of the selected feature;

inserting a first polygon to be resolved by the second mask within the region;

determining a second difference of density by comparing the first density of the first set of the features to the second density of the second set of the features and a density of the first polygon; and determining another polygon to be resolved by the second mask based on the second difference of density when the second difference of density exceeds a threshold value.

18. The method according to claim 17, comprising:

determining a portion of the region based on the first and/or second difference of density, wherein the first polygon is positioned within the portion of the region; and initiating a design rule check of only a portion of the IC design, the portion of the IC design comprising the first polygon.

19. The method according to claim 17, wherein the first set of features are to be resolved by the first mask, and the second set of features are to be resolved by the second mask.

20. The method according to claim 17, wherein the first set of features are positioned in a first portion of the layer, and the second set of features are positioned in a second portion of the layer separated from the first portion.

\* \* \* \* \*